(12) United States Patent
Kim et al.

(10) Patent No.: US 10,716,213 B2
(45) Date of Patent: Jul. 14, 2020

(54) DIRECT CONNECTION OF HIGH SPEED SIGNALS ON PCB CHIP

(71) Applicant: Cray Inc., Seattle, WA (US)

(72) Inventors: Hyunjun Kim, Mercer Island, WA (US); Andy Becker, Eau Claire, WI (US); Jim Fitzke, Eau Claire, WI (US); Brad Smith, Chippewa Falls, WI (US); Paul Wildes, Eau Claire, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/048,267

(22) Filed: Jul. 28, 2018

(65) Prior Publication Data
US 2020/0037448 A1    Jan. 30, 2020

(51) Int. Cl.
| | |
|---|---|
| *H05K 1/18* | (2006.01) |
| *H05K 1/11* | (2006.01) |
| *H01B 11/18* | (2006.01) |
| *H01R 12/71* | (2011.01) |

(52) U.S. Cl.
CPC ............. *H05K 1/181* (2013.01); *H01B 11/18* (2013.01); *H01R 12/716* (2013.01); *H05K 1/117* (2013.01)

(58) Field of Classification Search
CPC ............................ H01R 12/75; H01R 12/716; H01R 12/51–53; H01R 12/59; H05K 1/181
See application file for complete search history.

(56) References Cited

U.S. PATENT DOCUMENTS

| | | |
|---|---|---|
| 5,373,187 A | 12/1994 | Sugino et al. |
| 7,109,575 B2 | 9/2006 | Kang et al. |
| 7,652,381 B2 | 1/2010 | Grundy et al. |
| 7,898,729 B2 | 3/2011 | Maryfield et al. |
| 7,989,929 B2 | 8/2011 | Fjelstad et al. |
| 8,405,229 B2 | 3/2013 | Antesberger et al. |
| 8,711,575 B2 | 4/2014 | Lee |
| 8,994,188 B2 | 3/2015 | Yu et al. |

(Continued)

FOREIGN PATENT DOCUMENTS

| | | |
|---|---|---|
| WO | 2003046983 A1 | 6/2003 |
| WO | 2012138924 A1 | 10/2012 |

OTHER PUBLICATIONS

Search Report and Written Opinion received for PCT Application No. PCT/US2019/043831, dated Sep. 18, 2019, 09 pages.

*Primary Examiner* — Timothy J Thompson
*Assistant Examiner* — Amol H Patel
(74) *Attorney, Agent, or Firm* — Hewlett Packard Enterprise Patent Department

(57) ABSTRACT

To eliminate signal loss and sources of signal attenuation, a connection methodology is utilized which enables high-speed signals to be directly communicated from particular integrated circuits housed on a printed circuit board, to other locations within a system. More specifically, a signal escape strategy directly connects a high-speed cable to a point on the circuit board which is very close to the integrated circuit itself. A back-side connection methodology is utilized so that electrical signals pass directly from the integrated circuit through a via, to a connection point on the backside of the circuit board. To accommodate this connection, a specially designed interposer and related paddle cards are utilized so the high-speed communication cable can be easily attached.

15 Claims, 8 Drawing Sheets

(56) References Cited

U.S. PATENT DOCUMENTS

| | | |
|---|---|---|
| 9,142,533 B2 | 9/2015 | Shen et al. |
| 9,276,140 B1 | 3/2016 | Tam |
| 9,324,678 B2 | 4/2016 | Ganesan et al. |
| 9,335,500 B2 | 5/2016 | McLaren et al. |
| 9,350,124 B2 | 5/2016 | Rathburn |
| 2013/0230272 A1 | 9/2013 | Raj et al. |
| 2014/0002935 A1 | 1/2014 | Chen et al. |
| 2015/0147895 A1* | 5/2015 | Hanna .................. H01R 12/79 439/62 |
| 2016/0120034 A1 | 4/2016 | Chen et al. |
| 2018/0220528 A1* | 8/2018 | Ikeda .................. H05K 1/0271 |

* cited by examiner

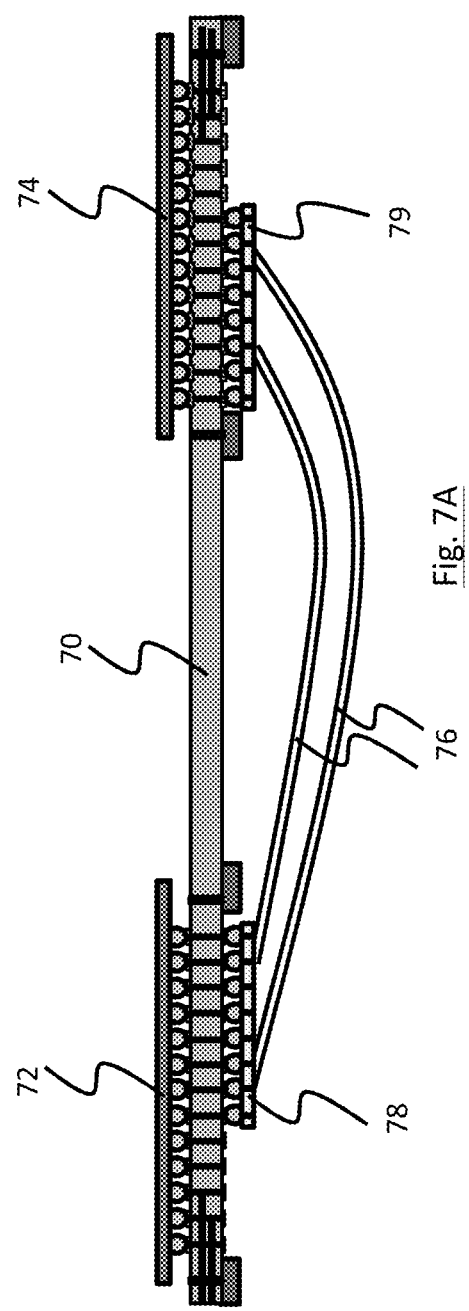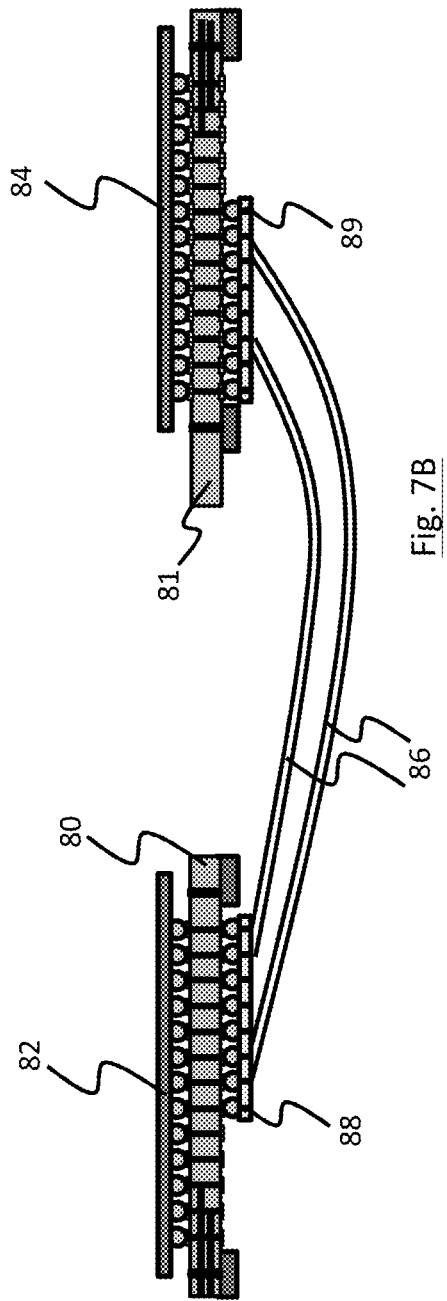

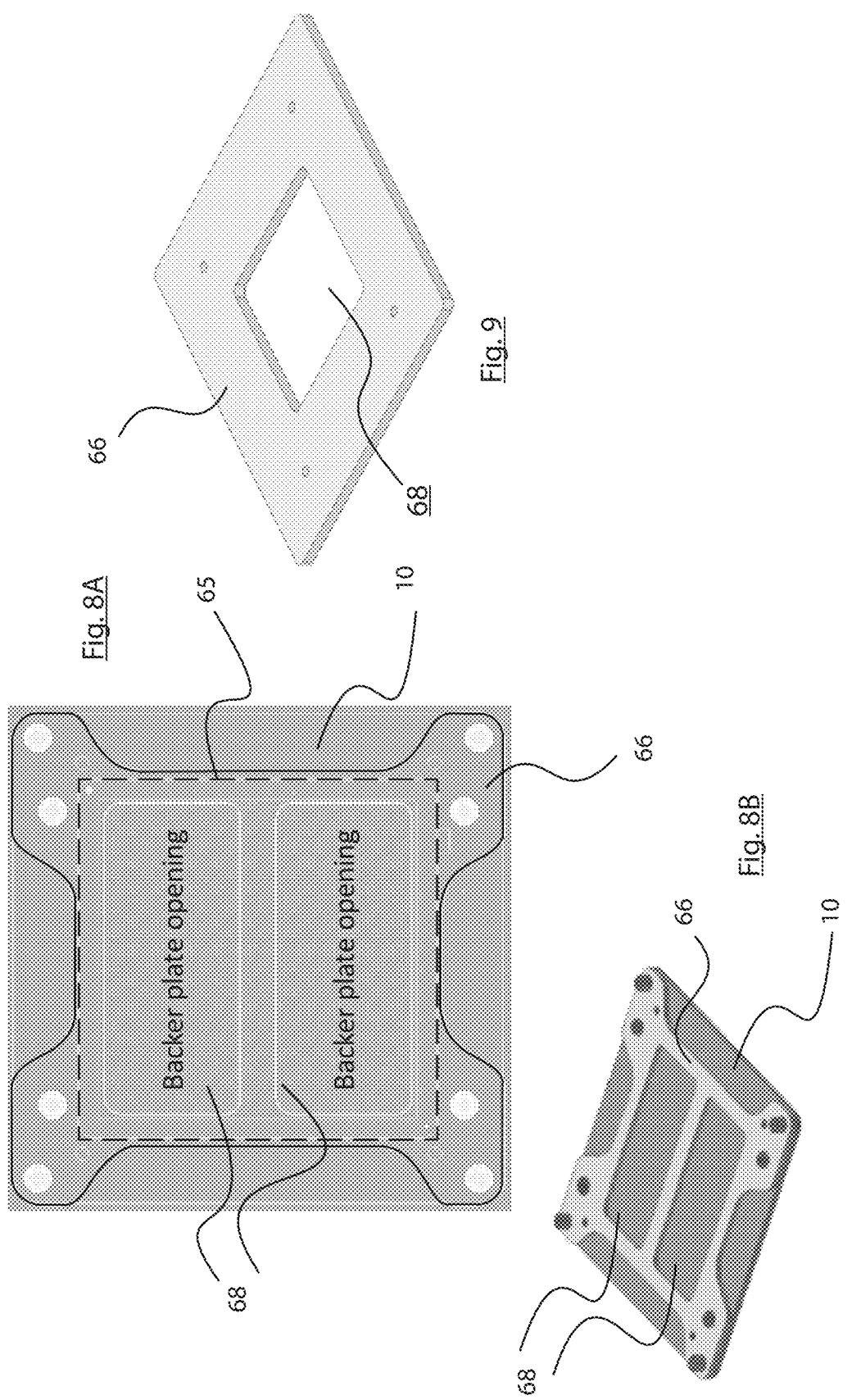

DIRECT CONNECTION OF HIGH SPEED SIGNALS ON PCB CHIP

BACKGROUND

In various electronic devices and systems, the communication of high-speed electronic signals between components creates several challenges. Specifically, when transmitting signals at high speeds, signal deterioration, additional loss factors and attenuation losses can significantly affect the quality of signals being communicated. Consequently, it is often necessary to carefully consider the signal transmission structures being used.

As is well known, printed circuit boards (PCBs) are commonly used in today's electronic devices to support several cooperating components and provide necessary communication between these components. Similarly, complex systems often utilize multiple printed circuit boards, with appropriate interconnections allowing for the cooperation of the various circuits and/or subsystems contained on each circuit board. In one example, several circuit boards will be housed within a cabinet and connected with one another via a backplane connection system. Other connection schemes involve connectors placed directly on the circuit board, which allow a second PCB to be connected thereto.

As PCBs have evolved, the complexity of the electronic components, and the complexity of the signal transmission structures on the PCB have evolved considerably. Modern day circuit boards are typically multi-layer structures, with communication paths extending between hundreds of different components. As such, the board layout and interaction of all structures can potentially effect system operation and efficiency.

In current PCB design, there is an increased demand for high-speed communication capabilities. This often requires the communication of high-speed or high-frequency signals between two or more mounted components, with signals being carried by various communication paths extending through the circuit board structure. These communication paths may extend for relatively short distances or may extend longer distances depending upon the nature of the circuit board and the environment within which the board is used. In some cases, communication paths may simply be a few centimeters in length, while other cases require these paths to be one to two meters. Realistically, circuit board structures typically do not exceed this size, thus one to two meters is often a practical upper limit. In other systems, it is necessary to provide communication capabilities between multiple circuit boards that are space some distance apart.

As mentioned above, the high-speed signal transmission often demanded by various computing systems typically involves signals with a frequency range up to 56 gigabits per second (Gbps), or even higher. In many situations, a stripline structure is utilized to carry high-speed signals within a PCB. Transmitting signals via a stripline structure at this speed often creates several complications and creates a need to closely examine signal losses throughout the PCB.

Printed circuit boards are beneficial in many applications since they provide an inexpensive and ubiquitous way to transmit high-speed data between various electrical components in many different systems, including data communication systems. That said, circuit board structures typically display a relatively high level of electrical loss as high-speed data signals traverse the PCB. Typically, these signals are communicated through a confining transmission line structure or stripline structure which is designed to propagate the signal's electromagnetic energy. Transmission lines in general must confine this signal energy and allow it to propagate relatively unimpeded, without incurring too much electrical loss, either in the form of skin-effect metal resistive loss or as dielectric loss in the surrounding material. As this suggests, high-speed connections (i.e. high-speed communication paths) are subject to multiple detrimental effects, such as signal loss (also referred to as signal attenuation), signal deterioration and unwanted reflections, all caused by the inherent characteristics of known substrate structures.

Although the above-mentioned backplane communication structure can provide one method to support communication amongst various circuit boards and/or systems, occasionally it is necessary to provide direct connection via alternative methods. For example, it may be necessary to utilize a connector and twinax cable which can communicate precise signals between particular components within a system. In these configurations, high-speed signals are communicated using the cable assembly having connectors on each end. The board will include a connector, which facilitates the connection of the twinax cable connectors. Unfortunately, the layout of particular circuit boards requires that a signal be routed from a particular chip or component, to a connector location on the board. In this situation, the high-speed signals are routed via microstrip or stripline to an edge of the board, which is a better suited area or location for connectors and related assemblies. This approach however, incorporates all of the above-mentioned issues involving micro-strip or stripline signal communication.

As is well known, typical CPU chips or ASIC chips have high-density connection mechanisms, such as ball grid arrays (BGAs) which facilitate connection to appropriate communication pads on the circuit board. Unfortunately, these ball grid arrays, or similar high-density connection mechanisms, make it very difficult to manage signal communication, and require the well-planned use of circuit board areas. This is one reason high-speed signals are typically routed to an edge or remote location on the circuit board. While this routing does achieve the desired goal of accommodating connection to a connector socket, it does require additional space on the circuit board (or within a particular layer of the circuit board), thus creates certain additional challenges.

BRIEF DESCRIPTION OF THE DRAWINGS

Advantages of the various embodiments of the signal transmission structure described herein will be apparent by reading the following detailed description, in conjunction with the drawings in which:

FIGS. 7A and 7B show two examples of high-speed cables used to connect cooperating electric components;

FIGS. 8A and 8B illustrate one example of a backer plate; and

FIG. 9 illustrates an alternative backer plate.

DESCRIPTION OF THE PREFERRED EMBODIMENTS

A primary challenge in high-speed PCB design today is providing an appropriate structure for signal escape and interconnect when circuit boards which are physically separated by some distance, but need to be joined together by high-speed copper cabling. To address this challenge, the various embodiments described herein provide structures at both the chip and board level to efficiently achieve this connection.

Figure 5:
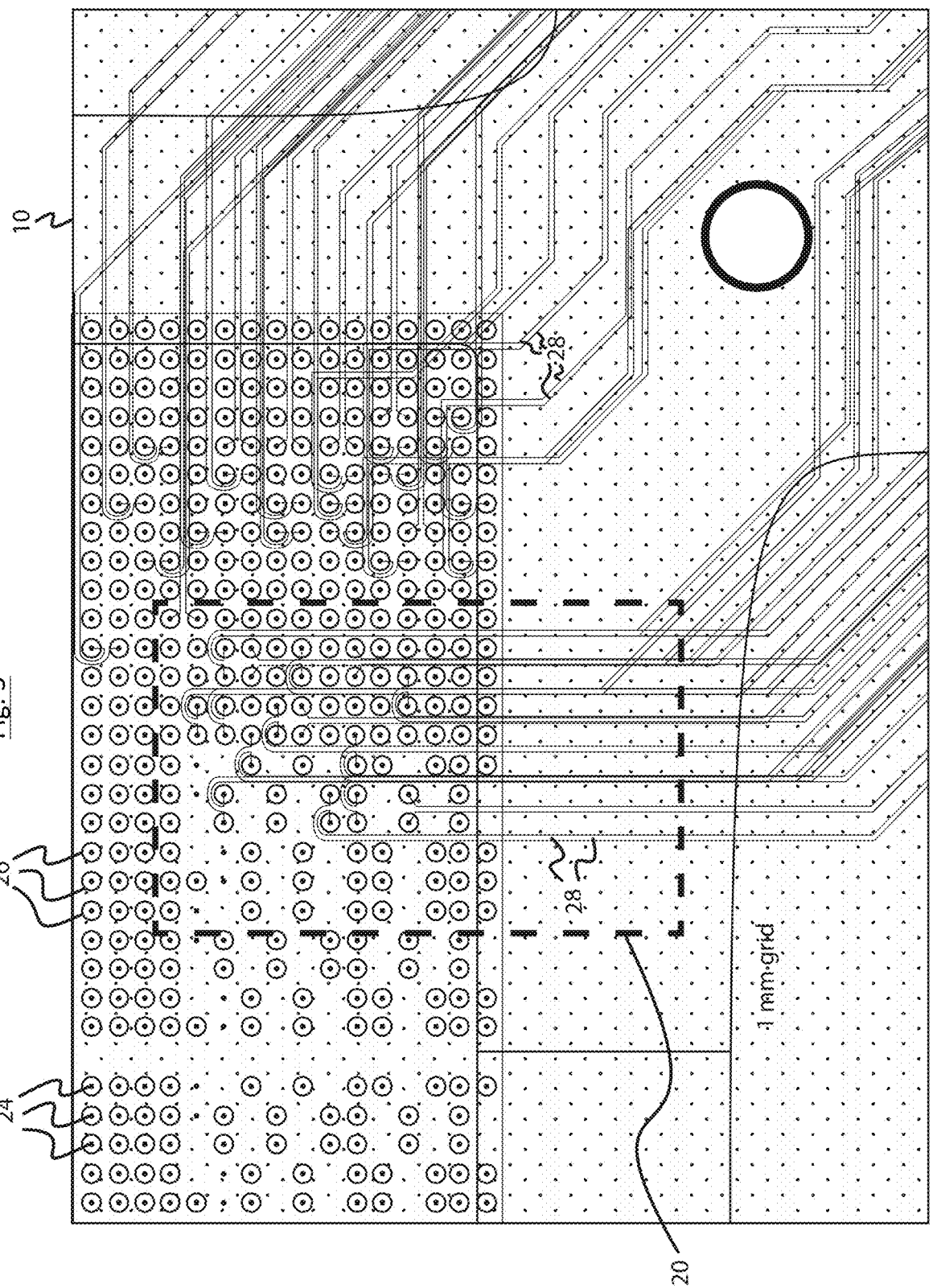
FIG. 5 is an exemplary illustration of a printed circuit board.

In current PCB design, structures are provided to achieve routing from within a chip, through the package (at micron scale) and through a ball grid array (BGA) attach onto the PCB. From here the signals are distributed through appropriate vias, to many different PCB layers and fanned out under the dense BGA ball field on the PCB using signal traces placed on the layers. At this point, the traces themselves fan out further and expand in width to reduce the significant losses experienced in stripline PCB transmission line routing. FIG. 5 presents an exemplary illustration of the various signal paths typically existing as a part of a common PCB, and provides one illustration of the typical signal escape routing found under a CPU. As discussed it is often necessary for signals to be carried to the edge of the PCB, where it is more convenient to place connectors. The inclusion of the connector itself creates further concerns. Near the board edge, the signal traces must transition again under the connector pin field and route up into vias to traverse the connector. Next, the signal is fed into the cable transition region, and to the cable. These cables are then used to carry signals to another PCB, where similar communication paths are used. Typically, twinax cable loss is much smaller (on the order of ⅒) than that of PCB stripline, given the same physical length. One currently available exemplary cable is a twinax high-speed cable distributed by 3M®. As further illustrated below, two advantages of this approach are (i) avoiding dense routing out of CPU area, and (ii) making use of twinax cable connections. This approach avoids the need to route through the PCB, thus achieving much lower signal attenuation from one point to the other.

Figure 1:
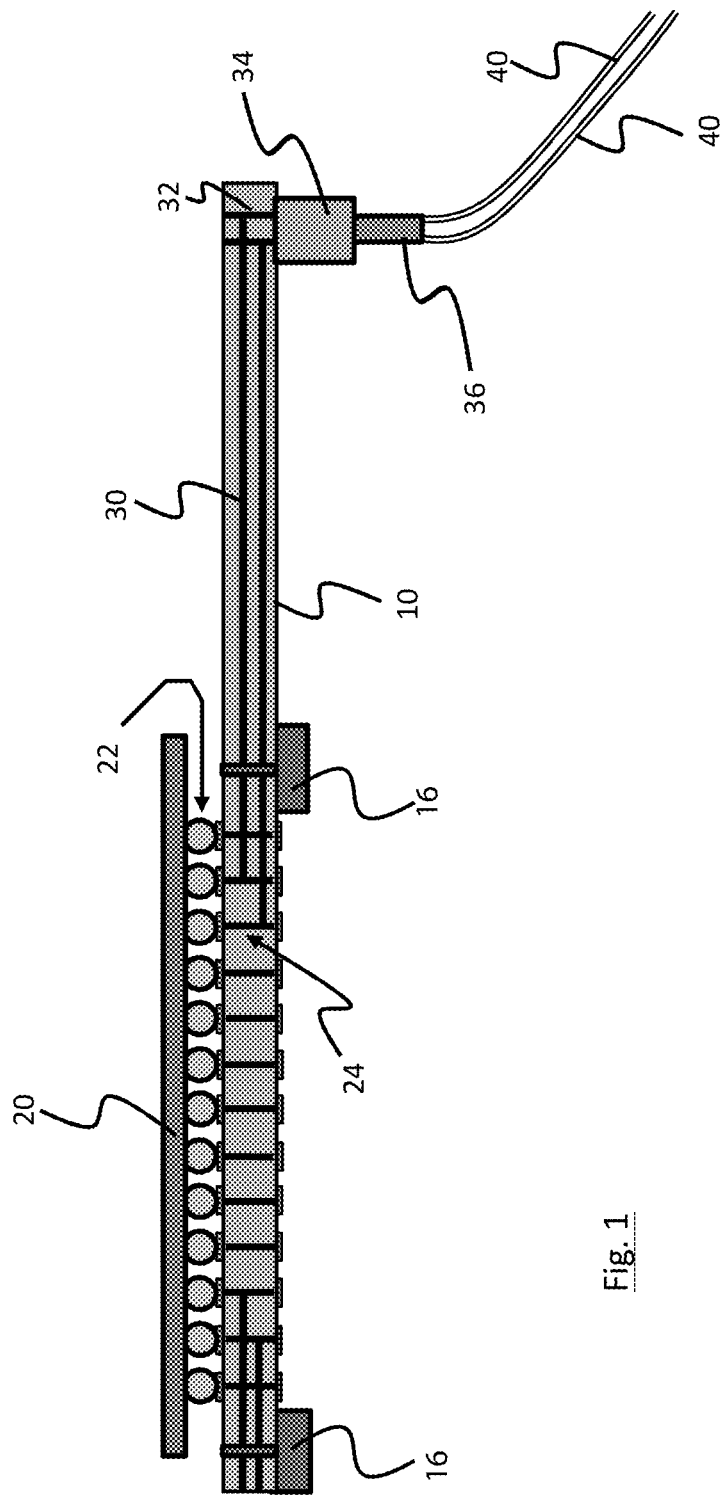
FIG. 1 is a schematic view showing on-board routing of high-speed signals.

Turning now to FIG. 1, a block diagram illustrates the signal transmission methodology used in typical circuit boards. As shown, a circuit board 10 is configured to support multiple components, including a CPU package 20 (alternatively an ASIC or other electronic component could easily be supported in the same way). It will be recognized by those skilled in the art that CPU package 20 is often attached at specified locations on circuit board 10 using a ball grid array (BGA), which is made up of multiple solder balls 22. Circuit board 10 is typically configured so that a plurality of vias 24 are positioned below CPU package 20 and related solder balls 22, which are used to provide communication paths. In this particular circuit board 10, pair of exemplary high-speed signal routing paths 30 are used to carry an electrical signal to connection vias 32. This provides one example of an exit or escape methodology which is commonly used, where the electrical signal is carried to a location where it can pass through a connector 34 and a related riser paddle card 36. Subsequently the signals are routed via a high-speed cable 40 to another system and/or component. The high-speed signal routing paths 30 can create issues which are undesirable, particularly when high-speed signals are transmitted. More specifically, these structures can create undesirable signal attenuation and loss.

In addition to the issues related to size and density of signal traces, the routing of signals within a PCB has the potential to create undesirable effects which are inherent to stripline communication. In an effort to eliminate or minimize the above effects, the embodiments described herein provide a connection methodology which allows signals to be quickly removed from the chip itself. Generally speaking, PCB routing is completely eliminated by directly attaching a cable assembly on the bottom side of a PCB, directly under the chip (e.g. a CPU or relevant ASIC). In order to achieve this attachment, a custom paddle card is provided, possibly including an additional socket or interposer that allows the cable assembly to be attached both mechanically and electrically. Such direct connection avoids the need for escape routing, or transmission of high connect signals to edges or other remote locations on the board. Further, this enables a direct interconnection between multiple circuit boards, employing a dedicated high-speed cabling mechanism. Such an approach however, requires the coordinated modification of several components including the chip package, the PCB, and related connector structures.

Starting at the chip level, it is necessary to design or modify the chip packaging so appropriate signals are presented from the chip, to a desired location on the package itself. When accommodations are made to insure that the signals are passed to a desired location on the package (i.e. typically a bottom surface), a common board connection technique can be used. For example, using the typical ball grid array (BGA), signals are provided (i.e. transmitted) directly from the chip itself to the circuit board. By designing the board so that appropriately configured vias are placed at necessary locations, desired signals can then be transmitted through the vias to desired locations on the backside of the board. As mentioned above, signals are typically fanned out across the PCB. In the preferred embodiment, the routing from the via to other locations on the PCB is completely eliminated. Instead, the via is configured to cause the signal to be passed through the board, and be presented at a back-side location. Connecting to other systems at this point (i.e. from the back-side) eliminates the need for routing, escape regions, and transition regions within the circuit board. As well recognized, these transition and escape regions or structures are common sources of loss or signal degradation, especially for high-speed signals.

With the desired signal presented directly from the chip to a location on a backside of the PCB, substantially direct connections to a high-speed cable are now possible. In one embodiment, a soldered interposer is attached to the backside of the PCB, directly linking the desired vias to a cable paddle card. As discussed above, by appropriately laying out the connections and via structures a select grouping of high-speed signals can easily and directly be accessed from the back-side of the PCB. Because these signals go directly through the vias to the back-side, they avoid the need to navigate the high-density pin field, and multiple electrical structures directly under the chip itself. Appropriate sockets and/or related structures on the custom paddle card can then accommodate direct connection of the desired cable, thus conveniently and quickly carrying signals to remote locations.

In one particular embodiment, the high-speed cable is directly connected to a single paddle card, which is connected to the circuit board as set forth above. In an alternative embodiment, the paddle card will include a connector itself, and the high-speed cable will be connected to a separate riser paddle card, which interacts with the connector. In this embodiment, the high-speed cable is removable, as necessary and/or desired. As set forth below, further alternatives are possible.

Figure 2:
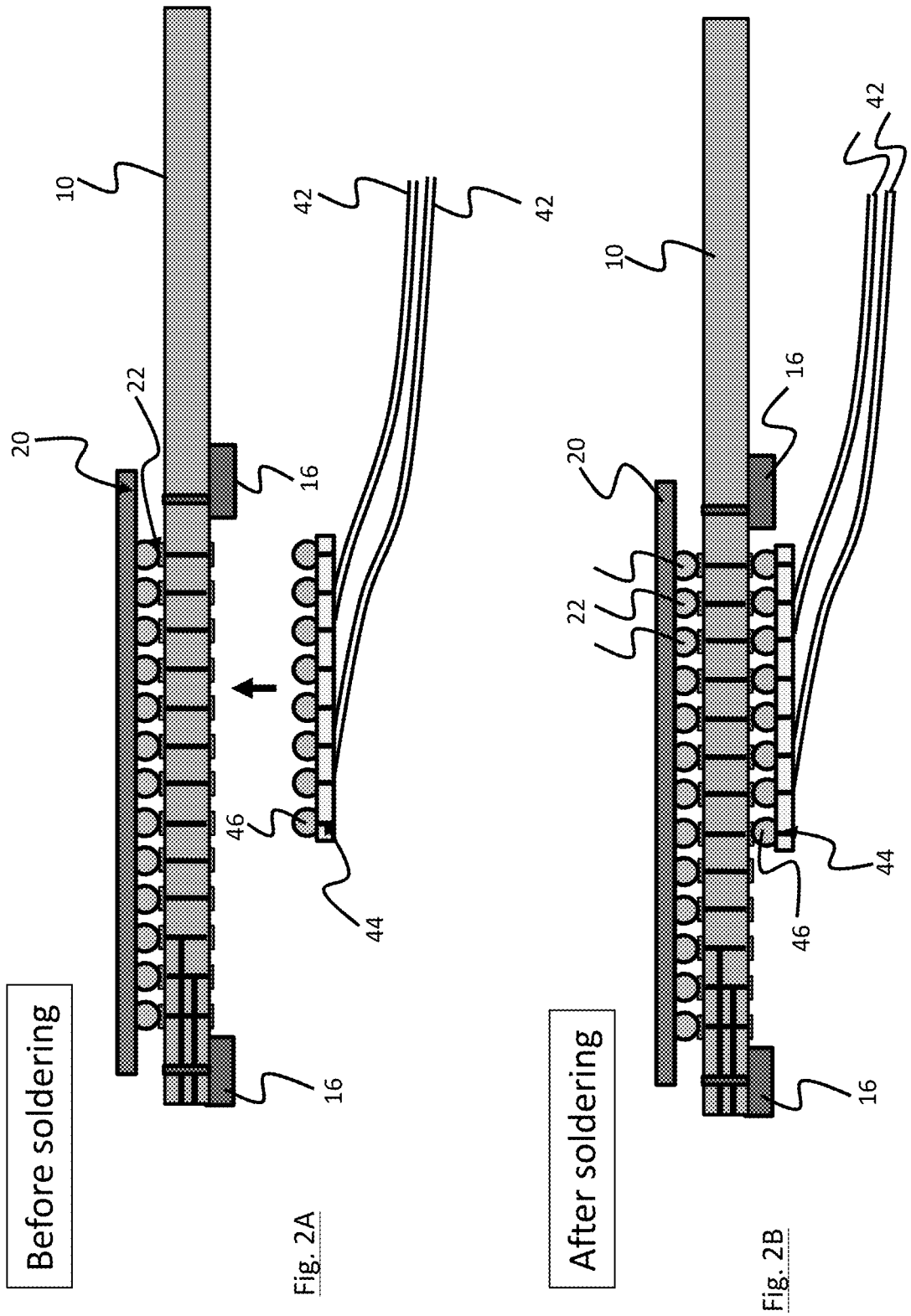
FIGS. 2A and 2B are schematic views of a first embodiment utilizing customized paddle card.

A first embodiment of the present invention, which provides an effective methodology for directing high-speed signals away from a printed circuit board, is illustrated in FIGS. 2A and 2B. Again, this embodiment cooperates with a circuit board 10 which is configured to support a CPU or related component 20 which is coupled via a ball grid array 21 made up of multiple solder balls 22. Here, PCB 10 is specifically configured to have plated through-hole vias 24, which provide direct communication from respective solder ball to a back-side thereof. In conjunction with PCB 10, a customized multi-layer paddle card is utilized to provide high-speed communication. Customized paddle card 44 includes BGA balls 46 which are specifically designed and configured to be coupled to the back-side of circuit board 10. As illustrated, FIG. 2A shows customized paddle card 44 prior to attachment or coupling (i.e. soldering) with PCB 10, while FIG. 2B illustrates this same component after soldering. As further illustrated, customized paddle card 44 includes high-speed cables 42 directly attached to surface connections. After soldering of customized paddle card 44, as specifically illustrated in FIG. 2B, a select grouping of high-speed signals can be directly transmitted from CPU 20 to customized paddle card 44, due to the direct connection of these components (using through-hole vias 24). Based on specific connections within paddle card 44, high-speed cables or twinax cables 42 are able to transfer high-speed signals to other circuit assemblies as needed.

As also illustrated in FIGS. 2A and 2B, circuit board 10 includes a backer plate structure 16 which can be used to physically support paddle card 44. Although not illustrated here, it is understood that such many types of physical supporting structures are possible.

Figure 3:
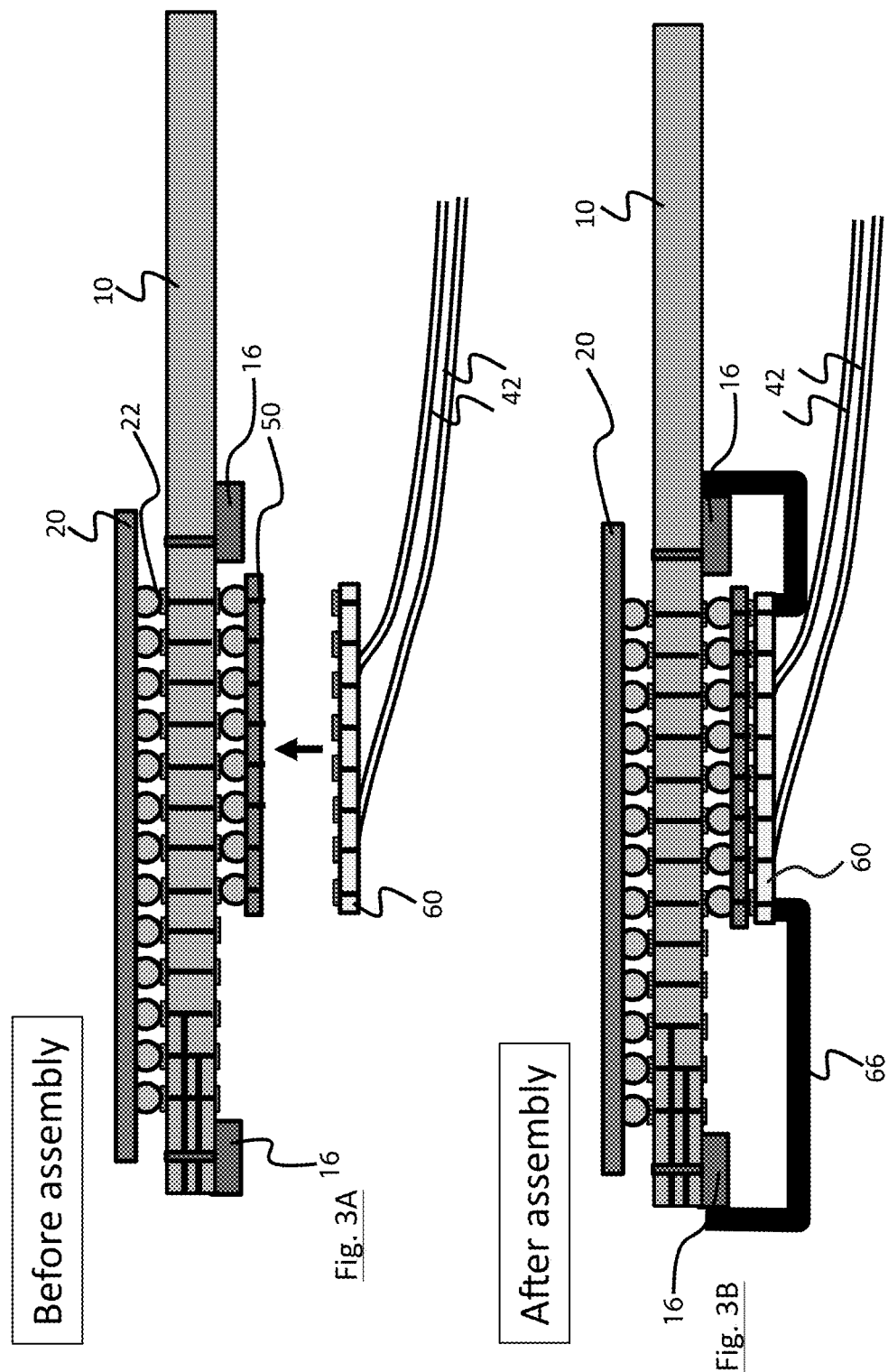
FIGS. 3A and 3B are schematic views of a second embodiment utilizing a removable paddle card, a PCB backer and an interposer.

In order to provide an alternative escape methodology, the embodiment shown in FIGS. 3A and 3B provides a soldered interposer or socket 50 attached to a second side of circuit board 10, also using a BGA connection methodology. Cooperating with interposer 50 is a paddle card 60, which is specifically designed to provide communication capabilities. Paddle card 60 includes appropriate connection structures to provide electrical signal pathways to high-speed cables 42 which are attached thereto. Again, high-speed cables 42 can then be utilized to carry electrical signals to subsequent systems and/or components. To accommodate the interposer 50 and paddle card 60, a retention clip 66 is utilized on the bottom side of the circuit board 10. As illustrated, retention clip 66 cooperates with portions of backer plate 16 to help hold paddle card 60 in place. Using this arrangement, paddle card 60 can be removable and/or replaceable, thus providing added flexibility to the systems involved.

Utilizing the connection structure illustrated in FIGS. 3A and 3B, a select grouping of high-speed signals is quickly and efficiently routed away from the CPU 20, and provided to other systems via the high-speed cable 42. Most significantly, the need for on-board routing of this select grouping of high-speed signals is eliminated.

Figure 4:
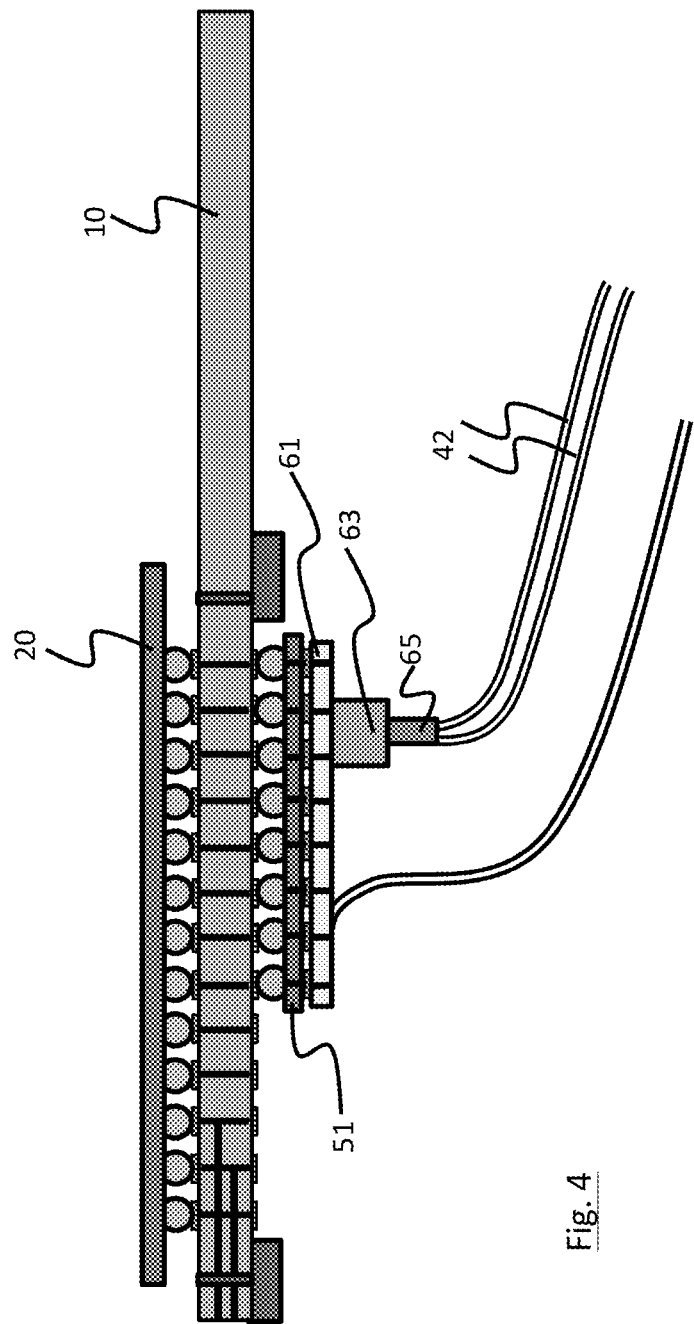
FIG. 4, illustrates an alternative embodiment using a paddle card in conjunction with riser paddle card.

Referring now to FIG. 4, an alternative embodiment is illustrated, which makes use of an alternative escape methodology. Here, similar components and structures are utilized, while also providing a removable connection. Again, a soldered interposer or socket 51 is attached to a bottom side of the circuit board 10. As in the previous embodiment, interposer 51 is attached to PCB 10 using a BGA, thus providing the desired electrical connections to specified points on circuit board 10. In this embodiment, a paddle card 61 is coupled to interposer 51. A connector 63 is also provided on paddle card 61 to accommodate further connections, and a riser paddle card 65 is designed to interact with connector 63. Second paddle card 65 is capable of being connected to the high-speed communication cable 42 to thus allow communication with other systems. Using this structure, electrical signals are easily and quickly routed from CPU 20 and transmitted to other components via high-speed cable 42 without the need for on-board signal routing. To accommodate the above-mentioned connections, a modified backer 66 (not shown) can again be utilized.

As briefly discussed above and to provide context for the above embodiments, FIG. 5 illustrates portions of circuit board 10, directly below the CPU package 20 (not illustrated in FIG. 5, but it's position shown in dashed lines). More specifically, FIG. 5 illustrates various layers of circuit board 10 overlaid on top of one another. Consequently, it will appear that certain signal traces are merged and connect to multiple connection pads. Those skilled in the art will recognize that this is an uncommon configuration, and that signal traces will more often be located on different layers, while possibly following similar paths. As previously mentioned, a plurality of vias 24 provide a communication path through the printed circuit board 10 to this lower surface. On the lower surface, a plurality of connection pads 26 are arranged in an array format to accommodate connection or communication, as needed. As can be seen in FIG. 5, this grid of connections is very dense, and includes a number of connection points in a very small area. A number of signal traces 28 are also shown, each carrying signals away from the connection pad 26. Signal traces 28 further highlight the density of areas below the CPU 20

As can be seen in FIG. 5, the high-density of various connection pads 26 creates several challenges and complications when attempting to route signals, and to provide all necessary connections. The density and relationship of parts must be maintained, which is typically problematic for high-speed communication signals. As such, this simply illustrates the benefits of direct access, or relatively direct escape, of the desired high-speed communication signal.

Figure 6:
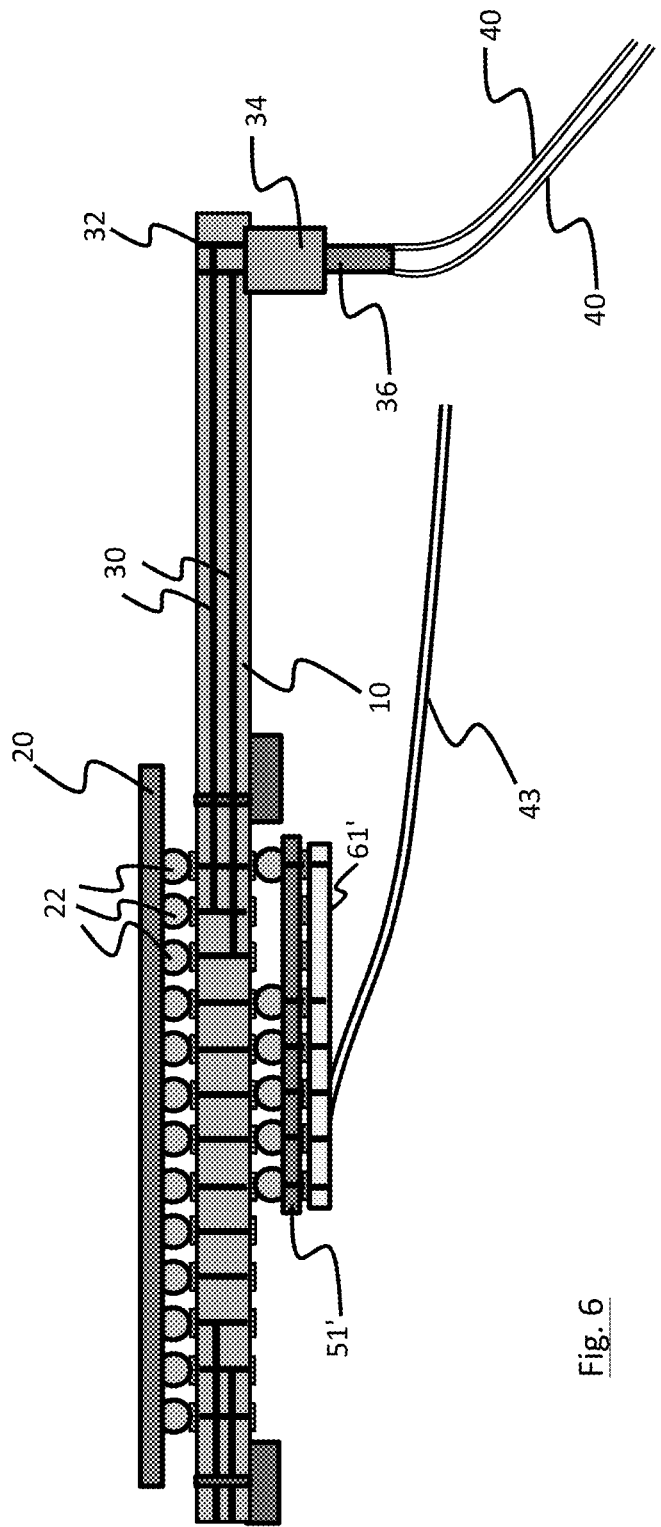
FIG. 6 is an addition illustration showing a combination of communication techniques.

While the concepts detailed above provide efficient mechanisms to transmit high-speed signals, it will be contemplated that various combinations could exist. As illustrated in FIG. 6, the conventional high-speed connector 34, which makes use of signal traces 30 extending though PCB 10 is included in this embodiment. In addition, an interposer 51' and a paddle card 61' are utilized to carry alternative signals away via high-speed cable 43. As will be appreciated, interposer 51' and paddle card 61' are substantially similar to those outlined above, however certain vias have been omitted and related solder balls are not included since the relevant signals are being carried away via signal traces 30. This illustrates how the various components and tools outlined above can be combined to allow a system designer to customize various products.

As discussed, the embodiments described make use of high-speed signals to carry a select grouping of high-speed signals between electronic components. FIG. 7A provides one embodiment of a select grouping of high-speed signals transmitted from a first CPU (or chip) 72 to a second CPU (or chip) 74, where both first CPU 72 and second CPU 74 are supported by a single circuit board 70. Here, a pair of high-speed cables 76 are used to form a high-speed communication path. As will be appreciated, a first 78 and a second paddle card 79 are attached to the bottom side of circuit board 70 using the connection methodology described above in relation to FIGS. 2A and 2B.

An alternative embodiment is illustrated in FIG. 7B, which has high-speed signals being transmitted between a first circuit board 80 and a second circuit board 81. More specifically, a pair of high-speed cables 86 are used to transmit a select grouping of high-speed signals from a first CPU (or chip) 82 to a second CPU (or chip) 84. Again, a first paddle card 88 and a second paddle card 89, respectively, achieve connections to high speed cables 86 using the methodology described above in relation to FIGS. 3A and 3B.

As generally suggested above, it is occasionally necessary to utilize a backer plate to provide physical support for various components. In the embodiment illustrated in FIG. 3B above, backer plate 66 is utilized to physically support paddle card 60. FIGS. 8A and 8B provide alternative views of backer plate 66, as attached to a PCB. As will be appreciated, this provides physical support along with "balancing", to counteract a cold plate typically mounted above CPU 20. As best illustrated in FIG. 8A, backer plate 66 will be positioned and aligned to be opposite the CPU 20. For purposes of illustration, the location of CPU 20 on the opposite side of PCB 10 is shown in dashed lines 65. Backer plate 66 further includes a pair of recesses 68, which are configured to accommodate paddle cards 60 discussed above. In a similar manner, FIG. 9 illustrates an alternative of a backer plate 66, which is greatly simplified. As will be appreciated, the various paddle cards mentioned above will typically be situated within recess 68 contained within a backer plate 66. As will be appreciated, multiple versions and embodiments of this structure are contemplated, depending on the physical shapes and sizes of components above.

The connection methodology described above, will completely eliminate the PCB routing, escape and transition regions, and all of their associated signal integrity impairments, by employing a soldered interposer to the backside of the PCB, directly linking the vias to a cabled paddle card. As an added benefit, the routing congestion under the package is reduced. This is an area where density issues on the PCB pose the biggest challenge. A select grouping of high-speed signals can thus be accessed this way from the backside of the PCB, under the dense package pin field, and easily distributed to a soldered cable interface on this paddle card, without navigating the large and dense pin field under the package. PCB etch length is also greatly reduced, and with it the insertion loss of the channel. The custom paddle card with an additional socket or interposer allows the cable assembly to attach to the PCB mechanically, for future repair and removal.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A circuit board assembly capable of transferring a select grouping of high-speed signals from an electronic chip to a second system, the assembly comprising:

a circuit board configured the support an electronic chip on a first surface thereof and to provide a plurality of electrical communication paths capable of carrying the select grouping of high-speed signals to and from the chip, the communication paths comprising at least one via extending through the circuit board and positioned below the chip capable of carrying at least one signal to a second side of the circuit board;

a paddle card positioned adjacent the second side of the circuit board and opposite the electronic chip, the paddle card having electrical connections to receive the select grouping of signals so that the select grouping of signals can be transmitted through the paddle card; and a high-speed cable electrically coupled to the paddle card configured to carry the select grouping of high-speed signals to the second system; and an interposer attached to the circuit board on the second surface of the circuit board at a location opposite the chip, and between the board and the paddle card, the interposer capable of allowing the select grouping of signals to be received and be present to the electrical connections on the paddle card.

2. The assembly of claim 1, wherein the electronic chip is contained within a package that is configured to present the predetermined signals to the via.

3. The assembly of claim 1 further comprising a communication cable connector which is attachable to at least one of the electrical connections.

4. The assembly of claim 1 wherein the predetermine signals are high frequency signals having an operating frequency of greater than 56 Gbps.

5. The assembly of claim 1 wherein the high-speed cable is a high-speed coaxial cable configured to carry the predetermined signals to the second system.

6. The assembly of claim 5 wherein the cable has a length within a range from 10 inches to 40 inches.

7. An electrical connection system for use in conjunction with high-speed electronic circuits, with the high-speed electronic circuits comprising at least one electronic chip supported by a printed circuit board, and the circuit board configured to pass a select grouping of signals from the electronic chip to at least one connection point directly below the electronic chip, the connection system comprising:

an interposer coupled to a surface of the circuit board at a position directly opposite the at least one electronic chip, the interposer having an electrical connection mechanism which is electrically coupled to said at least one connection point on the circuit board and is thus configured to receive the select grouping of signals;

a connector electrically coupled to the interposer, wherein the connector is configured to be attachable to a high-speed cable, wherein the cable is configured to carry the select grouping of high-speed signals from the electronic chip to a remote system; and a backer positioned on a side of the interposer opposite the circuit board to provide physical support for the interposer;

wherein the high-speed signal is to be communicated to the high-speed cable without being routed within the circuit board.

8. The assembly of claim 7, wherein the electronic chip is contained within a package that is configured to present the predetermined signals to a via directly below the chip.

9. The assembly of claim 7 wherein the predetermine signals are high frequency signals having an operating frequency of greater than 56 Gbps.

10. The assembly of claim 9 wherein the cable is a high-speed coaxial cable configured to carry the predetermined signals to a related electronic assembly.

11. The assembly of claim 10 wherein the cable is at least ten inches in length.

12. A circuit assembly to facilitate the communication of high-speed signals between an electronic chip and a cooperating electronic system, comprising:
- a circuit board having a first surface configured to support the electronic chip, the circuit board having a plurality of vias configured to facility electrical connections between the first surface of the circuit board to a second surface of the circuit board;
- a connection system providing electrical connections between the electronic chip and a connection portion of the vias at the first surface, thereby allowing communication of a select grouping of high-speed signals to be communication between the electronic chip and the vias;
- a paddle card having a plurality of electrical connections in communication with a portion of the plurality of vias situated on the second surface, wherein the select grouping of high-speed signals are transmitted between the vias and the plurality of electrical connection on the paddle card;
- a high-speed cable having a first end coupled to the paddle card and a second end coupled to the cooperating system so as to communicate the select grouping of high-speed signals between the paddle card and the cooperating system; and
- a connector assembly having a first portion coupled to the paddle card and second portion coupled to the high-speed cable, thus allowing the high-speed cable to be removably coupled to the paddle card;
- wherein the select grouping of high-speed signals are only transmitted between the first side of the circuit board and the second side of the circuit board using the plurality of vias and are not routed through the circuit board in any other way.

13. The circuit assembly of claim 12 wherein the connection system is a ball grid array.

14. The circuit assembly of claim 12 where in the paddle card is directly coupled to the second side of the circuit board by a second ball grid array.

15. The circuit assembly of claim 12 further comprising:
- an interposer coupled to the second surface of the circuit board at a position directly opposite the at least one electronic chip, the interposer configured to interact with the paddle card and the vias to allow communication there between;
- an electrical connection mechanism which provides an electrically coupling between the interposer and a connection portion of the vias at the second side of the circuit board; and
- a retaining structure holding the paddle card in contact with the interposer, thus accommodating communication to the high-speed electrical cable.

* * * * *